United States Patent [19]

Tamaki et al.

[11] 4,396,460

[45] Aug. 2, 1983

[54] METHOD OF FORMING GROOVE ISOLATION IN A SEMICONDUCTOR DEVICE

[75] Inventors: Yoichi Tamaki; Tokuo Kure; Takeo Shiba; Hisayuki Higuchi, all of Kokubunji, Japan

[73] Assignee: Hitachi, Ltd., Tokyo, Japan

[21] Appl. No.: 380,778

[22] Filed: May 21, 1982

[30] Foreign Application Priority Data

Jun. 10, 1981 [JP] Japan ............................. 56-88150

[51] Int. Cl.³ ..................................... H01L 21/308
[52] U.S. Cl. ..................................... 156/653; 29/571; 29/576 W; 29/580; 156/649; 156/657; 156/659.1; 156/661.1; 156/662; 156/667; 156/668; 357/49
[58] Field of Search ............... 156/628, 643, 648, 649, 156/653, 657, 659.1, 661.1, 662, 655, 668, 667; 29/571, 576 W, 580; 357/49

[56] References Cited

U.S. PATENT DOCUMENTS

| | | | |
|---|---|---|---|
| 3,985,597 | 10/1976 | Zielinski | 156/643 |
| 4,007,103 | 2/1977 | Baker et al. | 357/49 |
| 4,025,411 | 5/1977 | Hom-Ma et al. | 156/643 |
| 4,056,413 | 11/1977 | Yoshimura | 156/662 |
| 4,123,565 | 10/1978 | Sumitomo et al. | 156/657 |
| 4,199,384 | 4/1980 | Hsu | 156/648 |
| 4,307,179 | 12/1981 | Chang et al. | 156/661.1 |
| 4,307,180 | 12/1981 | Pogge | 156/649 |
| 4,333,965 | 6/1982 | Chow et al. | 156/649 |

OTHER PUBLICATIONS

Bartush et al., "Etch Back ... Process" IBM Tech. Discl. Bull. vol. 23 No. 8 (1/81) pp. 3676-3677.
Burkhardt et al., "Process ... Isolation" IBM Tech. Discl. Bull. vol. 22 No. 5 (10/79) pp. 1862-1863.

Primary Examiner—Jerome W. Massie
Attorney, Agent, or Firm—Antonelli, Terry & Wands

[57] ABSTRACT

After filling grooves with a filling material, this filling material is etched by the use of a double-layer film which is made of substances different from each other.

The side etching of the lower film of the double-layer film and the etching of the filling material are alternately performed in such a manner that each etching is carried out a plurality of number of times. Thus, the upper surface of the filling material contained in each groove can be flattened.

9 Claims, 11 Drawing Figures

METHOD OF FORMING GROOVE ISOLATION IN A SEMICONDUCTOR DEVICE

BACKGROUND OF THE INVENTION

1. Field of the Invention

The present invention relates to a method of manufacturing a semiconductor device. More particularly, it relates to a method of manufacturing a semiconductor device the respective elements of which are isolated by grooves having flat tops of small steps.

2. Description of the Prior Art

A semiconductor integrated circuit includes large numbers of active elements and passive elements such as transistors, diodes and resistors. Since these elements are formed within an identical semiconductor substrate, they need to be electrically isolated from one another.

In order to achieve the electrical isolation of the respective elements formed in the substrate, several methods have been proposed. Among them, a method called the "pn-junction isolation" has heretofore been employed most extensively.

This method exploits the fact that a pn-junction exhibits a high resistance when reverse-biased. It consists in forming pn-junctions between the elements so as to isolate the respectively adjacent elements.

As stated above, the pn-junction isolation has heretofore been the most common as the expedient for isolating the elements in semiconductor devices. Since, however, it involves such problems as a large required area and large parasitic capacitances, it is difficult of application to a semiconductor device having a high packaging density.

In order to solve such problems, a method called the "groove isolation" has been proposed.

This method consists in forming grooves, for example, U-shaped or V-shaped in section within the semiconductor substrate so as to isolate the respective elements by means of the grooves. It includes two cases; one case where the groove is entirely filled up with an insulator, and the other case where an insulating layer is formed on the side surface and bottom surface of the groove and where the remaining part is filled with polycrystalline silicon or the like. (Hereunder, the isolation employing the U-shaped or V-shaped grooves shall be written the "U-groove or V-groove isolation" in this specification.)

As compared with the aforementioned pn-junction isolation, this groove isolation has various merits such as a small required area, small parasitic capacitances and a great isolation voltage. However, it involves the following problems, the solutions of which are eagerly desired.

In case of performing the U-groove isolation, it is common practice to adopt a method in which, as illustrated in FIG. 1, a groove or recess is formed in a semiconductor substrate 1 in advance, a deposit material 2 such as insulator and polycrystalline silicon is deposited on the whole surface of the substrate by a well-known process such as the CVD (chemical vapor deposition), a mask 3 covering the groove is formed and the film of the deposit material 2 is chemically etched. (In case of employing polycrystalline silicon as the filling material 2, as will be described later, the bottom surface and side surface of the groove are covered with a thin insulating film, whereupon the polycrystalline silicon is deposited to fill up the groove. In order to facilitate understanding, however, the formation of the thin insulating film is not explained here.)

When the filling material film 2 is etched in the above method, a bulge 4 of the filling material appears at an end part of the groove and hampers the flattening of the upper surface of the groove as illustrated in FIG. 2. Especially, when the mask 3 for the selective etching deviates from the pattern of the substrate, there is the disadvantage that the bulge 4 becomes still larger.

When a wiring running on such bulge is formed, it is liable to disconnection due to the bulge. It is therefore difficult to form a semiconductor integrated circuit having a high reliability.

Accordingly, a method which can fill up the groove or recess provided in the semiconductor substrate into a flat upper surface is earnestly requested.

SUMMARY OF THE INVENTION

An object of the present invention is to eliminate the disadvantages of the prior art and to provide a method which can fill up a groove of any desired width at good flatness and form a flat top of the groove.

In order to accomplish the object, the present invention employs a double-layer film made of different materials as an etching mask for a filling material contained in a groove, and it etches the filling material while side-etching the lower layer film, thereby to prevent a bulge from appearing.

DETAILED DESCRIPTION OF THE PREFERRED EMBODIMENTS

Embodiment 1

FIGS. 3a to 3f show the steps of manufacture in an embodiment of the present invention.

Figure 1:
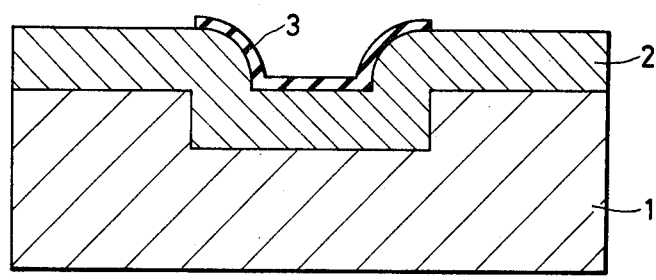
FIGS. 1 and 2 are sectional views of a semiconductor substrate showing a prior-art method of forming an isolation groove.
Figure 2:
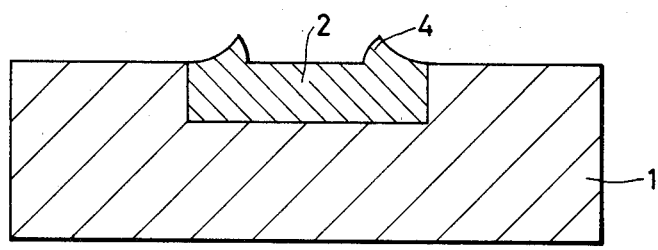
Figure 3A:
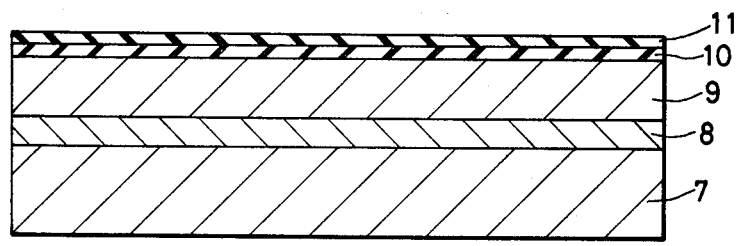
FIGS. 3a to 3f are processing flow diagrams showing an embodiment of the present invention.

As shown in FIG. 3a, a collector buried layer (0.5–1.5 μm thick) 8 was formed in the surface of a Si substrate 7 by a well-known expedient such as ion implantation and thermal diffusion. A Si epitaxial layer (1–2 μm thick) 9 was formed on the layer 8 by the well-known vapor epitaxial growth, whereupon its surface was thermally oxidized to form a $SiO_2$ film (100 nm thick) 10. Further, a $Si_3N_4$ film (100–300 nm thick) 11 was formed on the film 10 by the well-known CVD process.

Figure 3B:
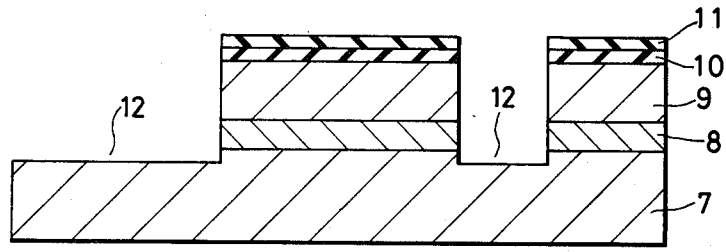
Figure 3C:
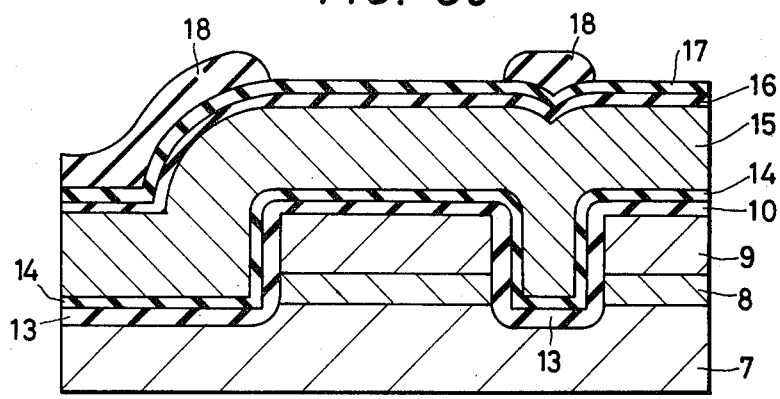

Subsequently, using the well-known photoetching, the $Si_3N_4$ film 11 was patterned to remove its parts corresponding to grooves to be formed, and the exposed parts of the $SiO_2$ film 10 were etched and removed. Next, using a dry etching technique such as reactive sputter etching, Si was etched to form the deep grooves 12 (2–4 μm deep) which reached the substrate 7 by penetrating the Si epitaxial layer 9 as well as the collector buried layer 8 (FIG. 3b). Under this state, an impurity of the conductivity type opposite to that of the buried layer 8 was introduced into the bottoms of the grooves 12 by the ion implantation in order to prevent the occurrence of channels. As shown in FIG. 3c, the surfaces of the grooves 12 were oxidized to form a $SiO_2$ film (200–600 nm thick) 13. After the remaining Si$_3$N$_4$ film 11 was etched and removed, a Si$_3$N$_4$ film (100–200 nm thick) 14 was formed on the whole surface of the resultant substrate again. Subsequently, polycrystalline Si 15 was deposited to a thickness approximately equal to the depth of the grooves 12 so as to fill up the grooves by the use of the conventional CVD process, its surface was oxidized to form a SiO$_2$ film (100–200 nm thick) 16, and a Si$_3$N$_4$ film (100–200 nm thick) 17 was formed thereon by the CVD process. Next, using the conventional lithography, a photoresist pattern 18 having a device (for leaving parts corresponding to the grooves) converse to the device of the grooves was formed.

Next, the Si$_3$N$_4$ film 17 was etched by employing the photoresist pattern 18 as a mask, and after removing the photoresist 18, the exposed parts of the SiO$_2$ film 16 were etched by employing the remaining parts of the Si$_3$N$_4$ film 17 as a mask. The etching of the SiO$_2$ film 16 at this time was excessively performed to the extent that the parts of the SiO$_2$ film 16 having underlain the remaining parts of the Si$_3$N$_4$ film 17 were side-etched or laterally etched about 1/5 of the depth of the grooves.

Figure 3D:
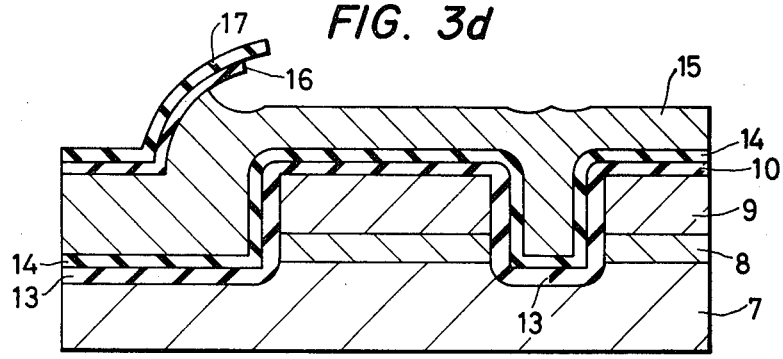
Figure 3E:
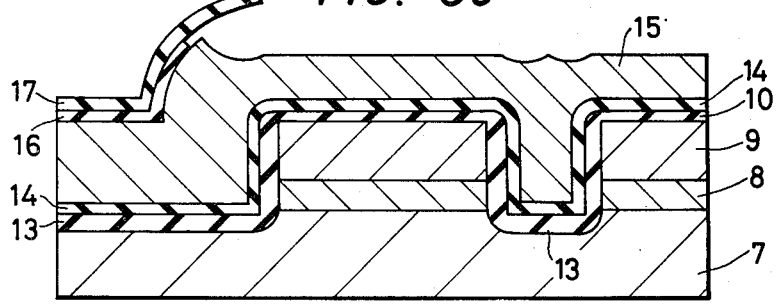

Subsequently, as shown in FIG. 3d, the polycrystalline Si film 15 was etched down to a half of its thickness with an etchant such as hydrazine (KOH, NaOH, or a mixed solution consisting of fluoric acid and nitric acid may well be employed). Here, the SiO$_2$ film 16 was side-etched about 1/5 of the depth of the grooves again (FIG. 3e).

The polycrystalline Si film 15 was etched again with the etchant such as hydrazine until the surface of the Si$_3$N$_4$ film 14 was exposed so that the polycrystalline silicon 15 might remain within the grooves only. After the SiO$_2$ film 16 underlying the pent roof of the Si$_3$N$_4$ film 17 was etched, an SiO$_2$ film (200–800 nm thick) 19 was formed in the surface of the polycrystalline Si 15 within each groove by thermal oxidation. The Si$_3$N$_4$ film 17 remaining on the surface of the resultant substrate was removed. Then, the isolation between elements was made as shown in FIG. 3f.

Figure 3F:
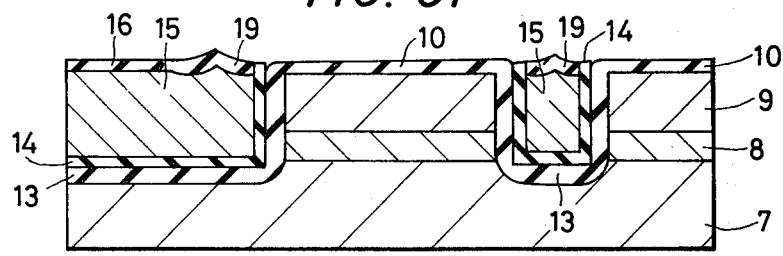

As seen from FIG. 3f, a bipolar LSI thus manufactured has an improved surface flatness in comparison with an LSI manufactured by the prior-art method. The disconnection of a wiring has been avoided, and the available percentage has risen sharply.

Embodiment 2

Figure 4A:
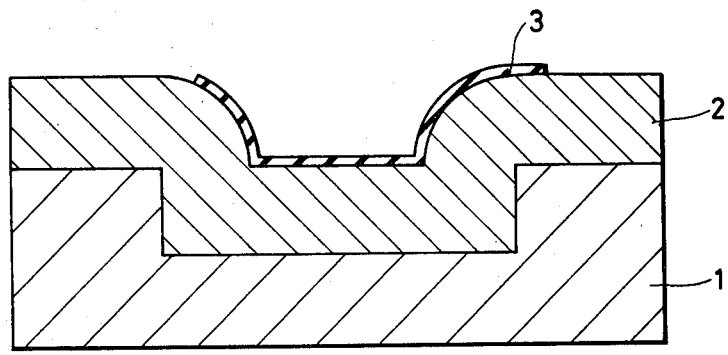
FIGS. 4a to 4c are processing flow diagrams for explaining another embodiment of the present invention.
Figure 4B:
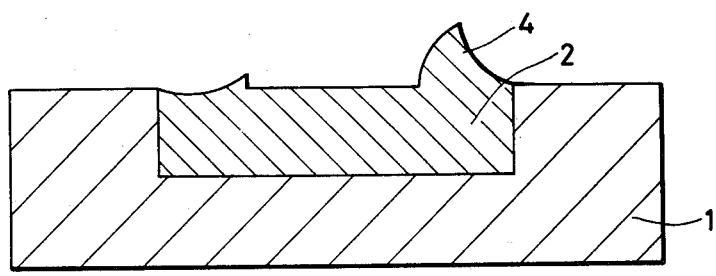
Figure 4C:
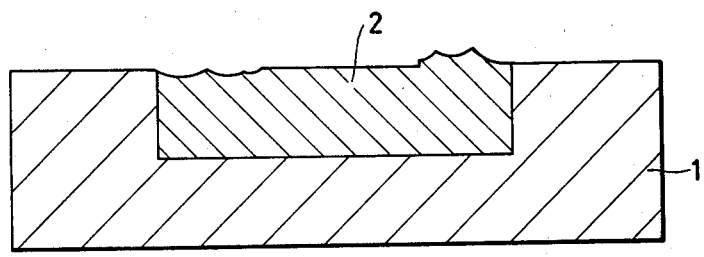

In Embodiment 1, the etching of the polycrystalline Si 15 and the side etching of the SiO$_2$ film 16 used as the etching mask of the polycrystalline silicon 15 were alternately performed in the manner that each etching was executed twice. A further increase in the number of times of the etching operations brings forth the merits that the flatness of the surface can be enhanced and that a step to appear becomes small even when the photoresist 18 has deviated on account of a misregistration in the mask alignment, etc. This will now be described in detail. In case the etching mask 3 has deviated as illustrated in FIG. 4a, the etching of the filling material 2 by the prior-art method poses the problem that a very large bulge 4 develops on one side of the groove as depicted in FIG. 4b. In contrast, according to the present invention, the bulge becomes very small and both the sides of the groove can be finished up substantially flat as shown in FIG. 4c. Here, FIG. 4c illustrates the sectional shape of polycrystalline silicon obtained in a case where each of the etching of the polycrystalline silicon and the side etching of the SiO$_2$ film used as the mask was carried out three times. When the side etching operations are performed a larger number of times in this manner, the amount of the side etching and the etching amount of the filling material are made smaller in the later operations. Thus, the occurrence of the bulge is effectively prevented, and also the occurrence of a recess ascribable to the retreat of the mask is prevented. This measure is very effective for realizing the flattening of the surface.

In this embodiment, polycrystalline Si was used as the material for filling the groove. The filling material, however, is not restricted to the polycrystalline silicon, but it is of course possible to employ an insulator such as SiO$_2$, Si$_3$N$_4$ and Al$_2$O$_3$ or an organic insulator such as "PIQ" (polyimide isoiindoloquinazolinedione, registered trademark of Hitachi Chemical Co.). For example, in case of employing SiO$_2$ (non-doped, or P-doped, B-doped, Ge-doped or the like) as the filling material 15, when the double-layer mask for the etching of the filling material consists of the lower layer 16 made of polycrystalline Si and the upper layer 17 made of Si$_3$N$_4$, the surface can be flattened by steps similar to those of the present embodiment. Needless to say, however, it is unnecessary to form the SiO$_2$ film 19 in this case.

This embodiment has been described as to the case where the present invention was applied to the isolation of a bipolar IC. The present invention, however, is applicable to various cases of flattening grooves or recesses, e.g., flattening the isolation regions or wiring conductors of a MOS-IC, and it is very useful.

Now, the applicability of the present invention will be supplementarily explained. As apparent from FIGS. 3c and 3d, in case of a narrow groove, any large step does not appear on the surface even when the groove is filled up with the filling material 15. In this case, the processing with the prior-art method brings about no hindrance in practical use.

In contrast, in case of a broad groove, the step approximately corresponding to the depth of the groove develops. Therefore, the occurrence of the large bulge is inevitable with the prior-art method, and the groove needs to be processed by the present invention.

When the groove has a width which is less than approximately double the depth thereof, it can be processed by the prior-art method.

However, in case the groove is wide more than approximately double the depth thereof, the present invention must be relied on.

For example, in case of a bipolar integrated circuit of the present day, the depth of each groove for isolating elements is approximately 3 μm. Therefore, when the width of the groove is greater than approximately 5–6 μm, the upper surface of the groove needs to be flattened by the present invention. When the packaging density increases more than at the present time, the depth of each groove for isolating elements is presumed to become approximately 2 μm or so. In this case, when the groove width is greater than approximately 4 μm, the present invention ought to be applied.

What is claimed is:

1. A method of manufacturing a semiconductor device, comprising the steps of:
   (1) forming a groove in a major surface of a semiconductor substrate,
   (2) depositing a filling material on the whole surface of the resultant substrate to fill said groove, (3) forming two superimposed films made of materials different from each other and the filling material, on the whole surface of the resultant substrate, (4) forming a resist pattern on parts of said two films overlying said groove, (5) etching and removing exposed parts of said two films by employing said resist pattern as a mask, (6) side-etching the lower one of said two films partially beneath the upper film, (7) partially etching said filling material employing the lower film as a mask, and (8) performing each of the steps (6) and (7) at least once more, to thereby remove the filling material existing outside said grooves.

2. A method of manufacturing a semiconductor device as defined in claim 1, wherein said filling material is polycrystalline silicon.

3. A method of manufacturing a semiconductor device as defined in claim 2, wherein prior to the step (2), an insulating film is formed on surfaces of said groove.

4. A method of manufacturing a semiconductor device as defined in claim 3, wherein said insulating film is a double-layer film which consists of a silicon dioxide film and a silicon nitride film.

5. A method of manufacturing a semiconductor device as defined in claim 2, wherein the upper one of said two films deposited in the step (3) is a silicon nitride film, while the lower one is a silicon dioxide film.

6. A method of manufacturing a semiconductor device as defined in claim 2 or 5, wherein said polycrystalline silicon is etched with an etchant.

7. A method of manufacturing a semiconductor device as defined in claim 6, wherein said etchant is selected from the group consisting of hydrazine, potassium hydroxide, sodium hydroxide, and a mixed solution consisting of fluoric acid and nitric acid.

8. A method of manufacturing a semiconductor device as defined in claim 1, wherein said filling material is selected from the group consisting of silicon dioxide, silicon nitride, aluminum oxide, and polyimide isoindoloquinazolinedione.

9. A method of manufacturing a semiconductor device as defined in claim 1, wherein a plurality of grooves are formed in the major surface of said substrate and said grooves are filled with said filling material.

* * * * *